US012711028B2

(12) United States Patent
Troia et al.

(10) Patent No.: US 12,711,028 B2
(45) **Date of Patent: *Aug. 18, 2026**

(54) FLASH MEMORY ARCHITECTURE IMPLEMENTING INTERCONNECTION REDUNDANCY

(71) Applicant: Lodestar Licensing Group LLC, Evanston, IL (US)

(72) Inventors: Alberto Troia, Munich (DE); Antonino Mondello, Messina (IT)

( * ) Notice: Subject to any disclaimer, the term of this patent is extended or adjusted under 35 U.S.C. 154(b) by 16 days.

This patent is subject to a terminal disclaimer.

(21) Appl. No.: 19/026,022

(22) Filed: Jan. 16, 2025

(65) Prior Publication Data

US 2025/0156283 A1 May 15, 2025

Related U.S. Application Data

(63) Continuation of application No. 18/535,899, filed on Dec. 11, 2023, now Pat. No. 12,216,553, which is a (Continued)

(51) Int. Cl.
*G06F 11/00* (2006.01)
*G06F 11/07* (2006.01)
(Continued)

(52) U.S. Cl.
CPC ........ *G06F 11/201* (2013.01); *G06F 11/0727* (2013.01); *G06F 11/1666* (2013.01); (Continued)

(58) Field of Classification Search
CPC ............. G06F 11/0793; G06F 11/0724; G06F 9/3861; G06F 9/3836; G06F 9/3877; G06F 9/541
(Continued)

(56) References Cited

U.S. PATENT DOCUMENTS 6,718,383 B1 * 4/2004 Hebert .................... H04L 45/22 714/4.11
8,516,298 B2 * 8/2013 Lu ....................... G06F 11/1666 714/763

(Continued)

FOREIGN PATENT DOCUMENTS

EP 1408513 A1 4/2004
JP 2000123567 A 4/2000

*Primary Examiner* — Sarai E Butler
(74) *Attorney, Agent, or Firm* — Fletcher Yoder, P.C.

(57) ABSTRACT

The present disclosure relates to a memory architecture comprising a plurality of subarrays of memory cells, a plurality of sense amplifiers connected to the subarrays, a plurality of original pads, at least one redundant pad, multiple data lines, and a redundant register connected to the plurality of original pads, to the plurality of redundant pads and to the data lines. The redundant register implementing an interconnection redundancy and connecting one of the redundant pads to the data lines when an addressed original pad is found defective. The disclosure also relates to a System-on-Chip (SoC) component comprising a memory architecture, and an interconnection redundancy managing block included into the memory architecture. A related memory component and related methods for managing interconnection redundancy of the memory architecture and/or the SoC are also disclosed.

20 Claims, 7 Drawing Sheets

Related U.S. Application Data continuation of application No. 17/956,140, filed on Sep. 29, 2022, now Pat. No. 11,841,777, which is a continuation of application No. 16/624,887, filed as application No. PCT/IB2019/000438 on May 31, 2019, now Pat. No. 11,461,197.

(51) Int. Cl.
*G06F 11/16* (2006.01)
*G06F 11/20* (2006.01)
*G06F 13/40* (2006.01)
*G11C 16/26* (2006.01)

(52) U.S. Cl.
CPC ...... *G06F 13/4022* (2013.01); *G06F 13/4027* (2013.01); *G11C 16/26* (2013.01); *G06F 2201/85* (2013.01)

(58) Field of Classification Search
USPC ........................................................ 714/1–57
See application file for complete search history.

(56) References Cited

U.S. PATENT DOCUMENTS 9,236,864 B1 1/2016 Loh et al.
2002/0120824 A1* 8/2002 Hooper, III ........... G06F 3/0679 711/202
2002/0168815 A1* 11/2002 Hartmann ............. H10W 46/00 257/E23.179
2003/0056141 A1 3/2003 Lai
2005/0128830 A1 6/2005 Nishihara et al.
2005/0144546 A1* 6/2005 Igeta ..................... H10P 74/277 714/37
2007/0271481 A1 11/2007 Kawakami
2008/0029844 A1* 2/2008 Adkisson ............ H10W 20/491 257/530
2008/0195894 A1 8/2008 Schreck
2009/0265715 A1* 10/2009 Erlingsson ............ G06F 9/4411 718/1
2011/0029813 A1 2/2011 Gunderson
2011/0060942 A1* 3/2011 Vorbach ........... H03K 19/17756 710/305
2011/0126045 A1 5/2011 Bennett
2012/0144230 A1* 6/2012 Buckland ............ G06F 11/2007 714/E11.054
2013/0003546 A1 1/2013 Mathews
2013/0117604 A1 5/2013 Ha
2013/0124914 A1* 5/2013 Liu ..................... G06F 11/1004 714/6.1
2014/0208151 A1* 7/2014 Fernandez ........... G05B 19/045 714/2
2014/0289560 A1* 9/2014 Nishi ...................... G06F 11/22 714/31
2015/0363258 A1 12/2015 Shin et al.
2016/0154717 A1* 6/2016 Alvarez-Icaza Rivera .................. H04L 49/552 714/4.2
2017/0277581 A1 9/2017 Lea
2017/0293514 A1 10/2017 Cadigan
2019/0156882 A1 5/2019 Kihara
2020/0293407 A1* 9/2020 Depoutovitch ..... G06F 11/1469

* cited by examiner

FLASH MEMORY ARCHITECTURE IMPLEMENTING INTERCONNECTION REDUNDANCY

PRIORITY INFORMATION

This application is a Continuation of U.S. application Ser. No. 18/535,899, filed on Dec. 11, 2023, which is a Continuation of U.S. application Ser. No. 17/956,140, filed on Sep. 29, 2022, now issued as U.S. Pat. No. 11,841,777 on Dec. 12, 2023, which is a Continuation of U.S. application Ser. No. 16/624,887, filed on Dec. 19, 2019, now issued as U.S. Pat. No. 11,461,197 on Oct. 4, 2022, which is a U.S. National Stage Application under 35 U.S.C § 371 of International Application Number PCT/IB2019/000438, filed May 31, 2019, the contents of which are incorporated herein by reference.

TECHNICAL FIELD

The present invention relates to a Flash memory architecture and in particular to a Flash memory architecture implementing interconnection redundancy.

BACKGROUND

Non-volatile memory can provide persistent data by retaining stored data when not powered and can include NAND Flash memory, NOR Flash memory, Read Only Memory (ROM), Electrically Erasable Programmable ROM (EEPROM), Erasable Programmable ROM (EPROM), and resistance variable memory such as phase change random access memory (PCRAM), self-selecting chalcogenide-based memories, resistive random access memory (RRAM), 3D XPoint memory (3DXP) and magnetoresistive random access memory (MRAM), among others.

More particularly, a Flash memory is a type of non-volatile memory that retains stored data and is characterized by a very fast access time. Moreover, it can be erased in blocks instead of one byte at a time. Each erasable block of memory comprises a plurality of non-volatile memory cells arranged in a matrix of rows and columns. Each cell is coupled to an access line and/or multiple data lines. The cells are programmed and erased by manipulating the voltages on the access and data lines.

Non-volatile Flash memories are today one of the fundamental building blocks in modern electronic systems particularly for Real Time Operating Systems (RTOS). The operation of non-volatile Flash memories is managed by a controller including an embedded firmware, such controller performing the required write/read/erase operations.

Memory cells are keen to defect, namely in very aggressive lithographic nodes. Redundancy is used to bypass defective cells and repair memory architecture failing a testing phase or showing failures in the field, for the so called redundancy on the fly. The root cause of defect can be different, i.e. depleted cells, defective oxide in the cell, defects in the connection with the physical cell, for instance due a broken vias, a short end cup, a oxide defectivity, etc.

In NOR memory devices, redundancy is usually by column. In particular, redundancy repairs local defect by changing a physical column comprising defective cell or cells with another one without defects, the redundancy columns being usually positioned at a boundary area of the memory array.

The implementation of the redundancy can be made by linking an address of a defective column and a target new address of a redundant column, so that, when the defective column is addressed, the memory device will enable the redundancy to store/read the content in the different redundant column being not defective.

Currently, the technology of complex semiconductor structures known as System-on-Chips (SoC) provides the integration of at least an embedded non-volatile memory in the system. However, the embedded memory, with the current technologies, is becoming the big macro in a SoC and it is not effective to increase the size, for example to more than 128 Mbit. In other words, nowadays the embedded memory shows a minimum not integrable density.

In other words, embedded memory in SoCs is more and more difficult to be managed when the lithography node is below a technology limit, for instance below 28 nm.

Connection between an embedded memory and other portions of a SoC also raises defectiveness problems tied to the contact between the pads of the memory and the system.

Large connection devices, as a Flash memory within a SoC, also called embedded Flash replacement, can thus have defects due to the interconnectivity, whatever is the redundancy strategy applied to the Flash memory architecture.

The presence of an interconnected pads defect can jeopardize completely the working of the SoC comprising the Flash memory, wasting a large amount of money, being the SoC, embedded Flash and package to be discarded, the corresponding silicon cost totally wasted.

Therefore, there is a need for providing a solution for defects tied to the interconnecting pads of an embedded Flash memory and a SoC, allowing to repair the already stacked device and improving the yield of a manufacturing process of such systems.

DETAILED DESCRIPTION

With reference to those figures, a memory architecture comprising an array of memory cells, in particular a Flash memory array provided with a selecting circuit implementing interconnection redundancy will be disclosed herein.

Figures 1A, 1B:
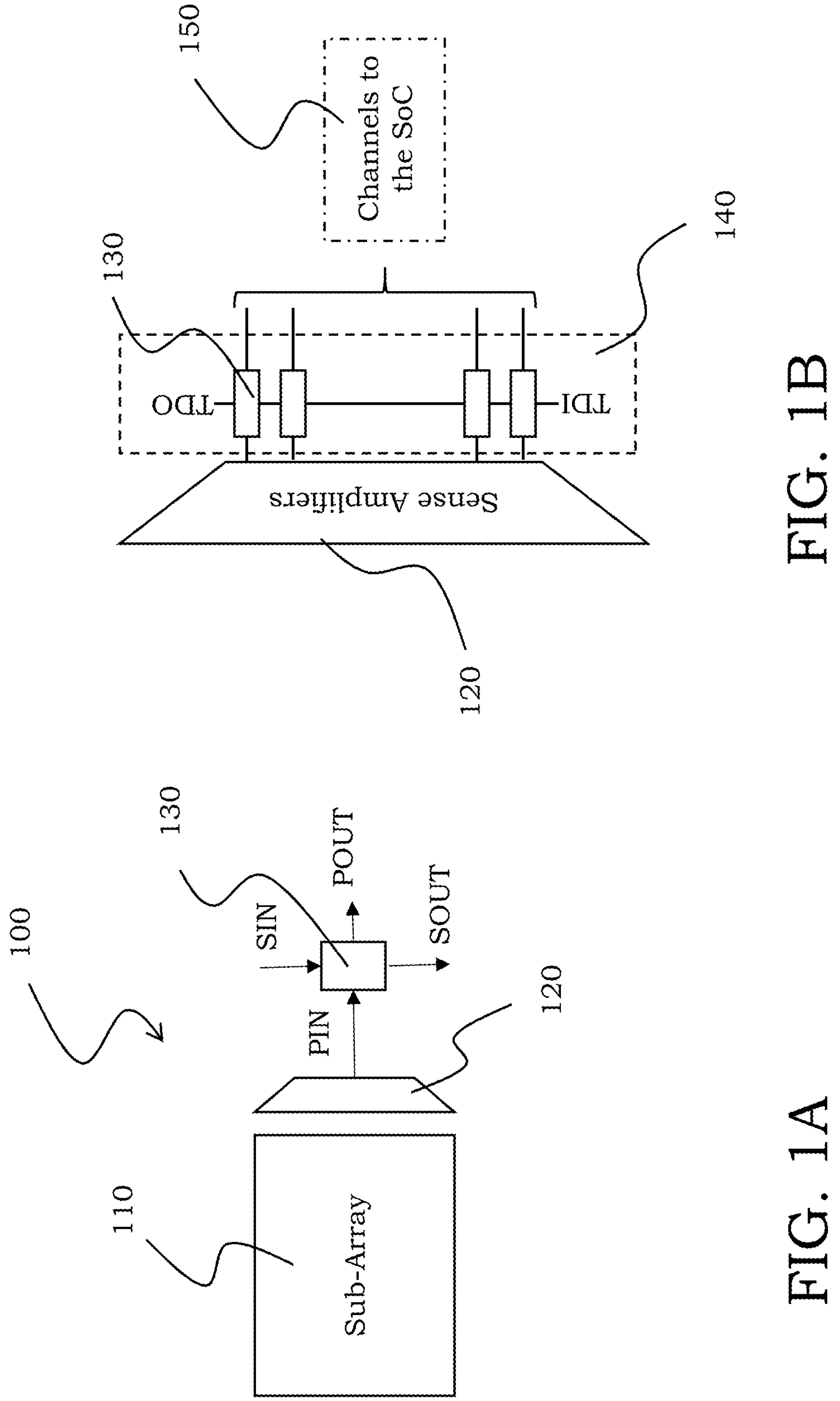
FIG. 1A shows a block diagram of a Flash memory subarray comprising sense amplifiers and a boundary cell.
FIG. 1B shows an enlarged view of a detail of the Flash memory subarray of FIG. 1A.

The example embodiment of FIG. 1A is a memory architecture 100 comprising a Flash memory subarray 110, the memory architecture comprising a plurality of subarrays all having a same structure.

More particularly, the Flash memory subarray 110 is connected to a sense amplifier 120, in turn connected to a boundary or Jtag cell 130, able to manage input and output serial data, SIN and SOUT, as well as input and output parallel data, PIN and POUT, respectively.

The output parallel data POUT are provided to a SoC (not shown) comprising the memory architecture 100. The memory architecture 100 is connected to the SoC using any packaging techniques.

A low signal count interface 140, with capability to modify the internal content of the Flash memory subarray 110, in particular using functional pins and corresponding signals TDI, TDO, tms, tck, trst according to the Jtag protocol, could be also included in the memory architecture 100, between the sense amplifiers 120 and the SoC, connected to the Jtag cells 130 whose parallel outputs POUT form interconnection channels 150 with the SoC, as shown in FIG. 1B.

As will be explained in the following description, the memory architecture 100 implements an interconnection redundancy able to correct defects tied to the interconnections between the memory architecture 100 and the Soc comprising it. Redundancy is replicated for each subarray of the memory architecture, the subarray outputs being the interconnection channels 150 with a SoC, not shown in the figures.

In particular, interconnection defects are tied to defective pads or defective connection between pads and the memory architecture 100 according to the embodiments of the present disclosure provides redundancy for all possible defective or defectively connected pads.

According to the subdivision of a memory architecture into a plurality of subarrays, 168 pads per channel is the current targeted implementation for a Flash memory architecture to be embedded in a SoC. Suitably, the present disclosure relates to a memory architecture 100 managing one or more defect(s) on any of the 168 pads.

Figures 2A, 2B:
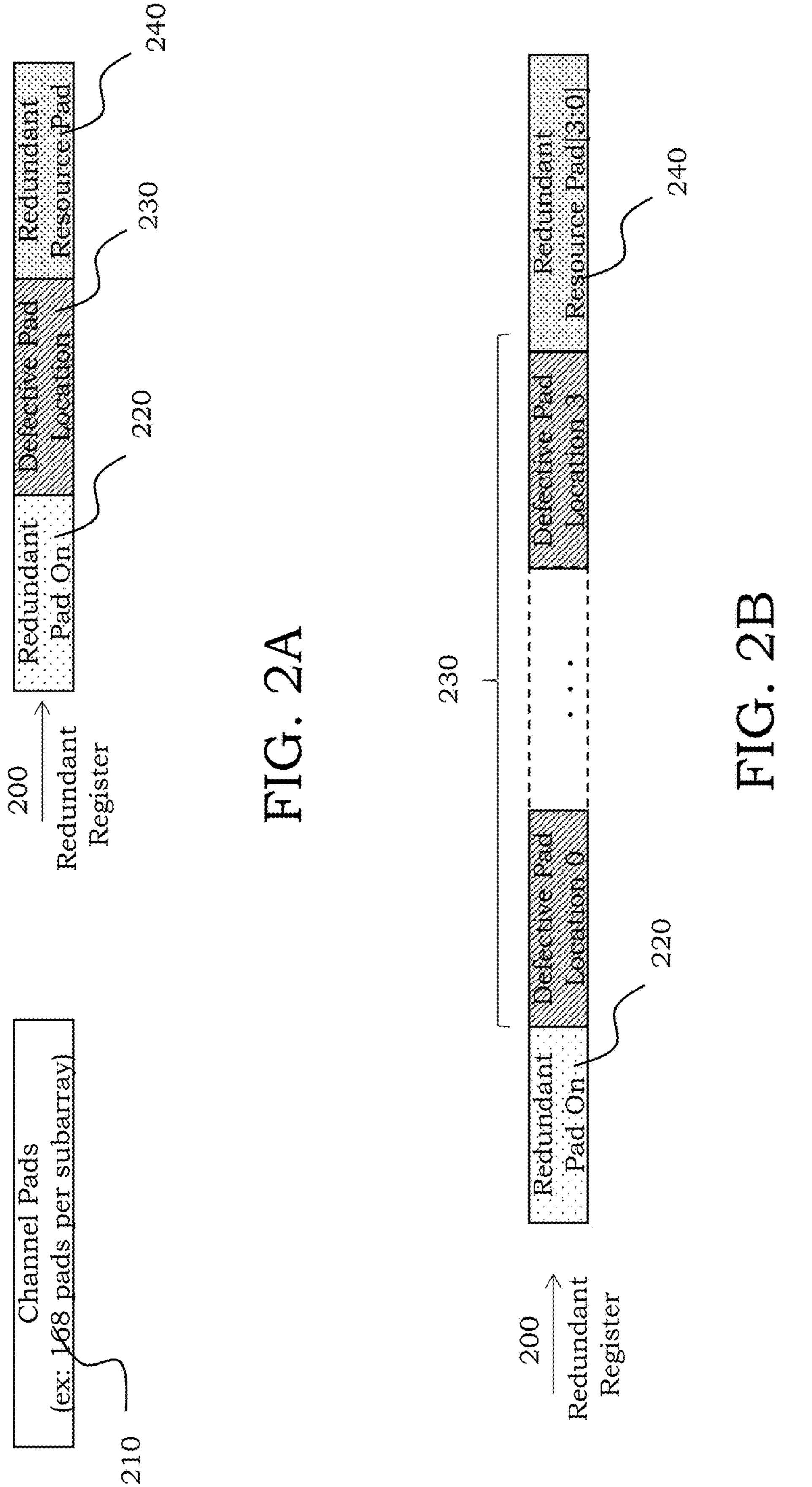
FIG. 2A shows a redundant register implementing single-pad interconnection redundancy in accordance with an embodiment of the present disclosure.
FIG. 2B shows a redundant register implementing multi-pads interconnection redundancy in accordance with an embodiment of the present disclosure.

In order to implement interconnection redundancy, the memory architecture 100 suitably comprises a redundant register 200, schematically shown in FIG. 2A. The redundant register 200 is addressed using a Jtag port in case of factory redundancy and the Flash controller or the host in case of on-field redundancy so as to properly set the redundancy, with or without the low pin count interface 140, such as a Jtag interface.

In particular, as shown in FIG. 2A, for each extended page of the Flash memory subarray 110, the redundant register 200 receives from the communication channel a bit address of an addressed memory cell of the Flash memory subarray 110 connected to a corresponding addressed pad, by means of a number of bit sufficient to identify the defective pad, for instance 8 bits, to be able to address 256 possible defective pads, sufficient for the example embodiment of 168 pads per channel and hence able to manage one defective pad. The pads bar for each Flash memory subarray 110 is indicated as 210 in FIG. 2A.

The redundant register 200 stores, using the Jtag interface, the info to enable the redundancy; the register can be programmed in factory and/or by the flash controller and/or the SoC, when the on field redundancy, also called on the fly, is implemented and available. More particularly, when the redundancy on the fly is implemented, the Jtag and/or the SoC and/or the Host can be used to program the register.

Moreover, an address bus, when latched, is used as read address in the raw data buffers associated to the raw address buffers.

As will be clear from the following description, the redundant register 200 implements a logic intercepting defects which is always on and compares any address used by each Flash memory subarray 110 of the memory architecture 100 and the SoC embedding it so to be sure that the data is correctly routed to the SoC.

When implementing single-pad redundancy, according to the embodiment shown in FIG. 2A, the redundant register 200 comprises a first portion 220 being a redundant flag of 1 bit (ON/OFF) indicating the usage of the redundancy, a second portion 230 for storing a location or address of the pads out of 168 that defective and a third portion 240 for storing a further location or address of a spare pad being used as redundant resource.

When implementing multi-pads redundancy, according to the embodiment shown in FIG. 2B for up to 4 pads redundancy, the redundant register 200 comprises a first portion 220 being a redundant flag of 1 bit (ON/OFF) indicating the usage of the redundancy, a second portion 230 comprising 4 (in the example here described) groups of bits for storing four locations or addresses of the pads out of 168 that defective (for example each group includes 8 bits, to be able to address 256 possible combinations and therefore one of the 168 possibly defective pads) and a third portion 240 for storing a further location or address of four spare pads being used as redundant resources.

It can be indicated that the multi-pads redundancy is thus implemented increasing the defective pads location fields of the second portion 230 and by increasing the Redundant Resource bits of the third portion 240; according to an example, with reference to the embodiment shown in FIG. 2B, the defective pads location fields are 8 bits, and the second portion 230 is thus 8 bits multiplied by 4, i.e. the number of the pads that can be used for the redundancy and similarly, the Redundant Resource bits are up to 4, each bit enabling the intercepting of the failing pad in the channel according to the following logic:

Bit 0: redundancy resource pad 0
Bit 1: redundancy resource pad 1
Bit 2: redundancy resource pad 2
Bit 3: redundancy resource pad 3

More particularly, according to the single-pad redundancy embodiment of the present disclosure only a spare pad is uses, the third portion 240 being a field of 1 bit, in essence a further flag. In some embodiments, such third portion or further flag is not used, and the sole redundancy resource pad is directly activated; for example, the pad may be hard wired. According to the multi-pads redundancy embodiment, more than one spare pad is used, the third portion 240 being more than one bit, for instance, a 4 bits field able to implement up to four redundant locations or addresses of the spare pads, along with a four fields of 8 bits of the second portion 230.

It can be thus indicated that the first portion 220 of the redundant register 200 is a flag indicating that the redundancy is ON, the second portion 230 of the redundant register 200 is a pads defective area and the third portion 240 of the redundant register 200 is a redundancy resource field.

According to the embodiment, when a pad is found defective, its address is stored in the second portion 230 and the redundant flag of the first portion 220 is enabled (ON), so that one of the redundant pads, having been enabled by the further enabling signal stored in the third portion 240, is switched with the defective one. In other words, when the redundant flag of the first portion 220 is ON, the corresponding logic intercepting defects is always on and compares any address used by each Flash memory subarray 110 to substitute the address of memory cells corresponding to pads being found defective.

In particular, the redundant flag of the first portion 220 is ON, the content of the third portion 240 being the redundant resource is used to send the data to the SoC.

During the normal working, the universe of pads is monitored and compared with the universe of defective pad location sections of the whole enable redundant registers; when the defective location is addressed, the switch with the redundant resources is executed, the redundant flag of the first portion 220 being checked for its own status: enable or disable, i.e. ON or OFF.

In the case that the enable status is set (ON), the redundant pad whose address is stored in the third portion 240 is routed using a multi-channel MUX, so to replace the defective pad whose address is stored in the second portion 230.

The redundancy register 200 is replicated in each sub array and the content of the corresponding portions 220, 230 and 240 stored in the Flash configuration area, because the corresponding stored data, as other setting data, are stored only once.

As already indicated, according to the embodiments of the disclosure, the redundancy is always on after the power up of the Flash memory architecture 100 and the SoC embedding it so as to monitor continuously the communication channel, i.e. 168 pads, in the case taken as an example in the present description.

In case of a multilayer memory architecture 100, a defective pad is to be substituted for all layers or pages connected to such a defective pad.

Figure 2C:
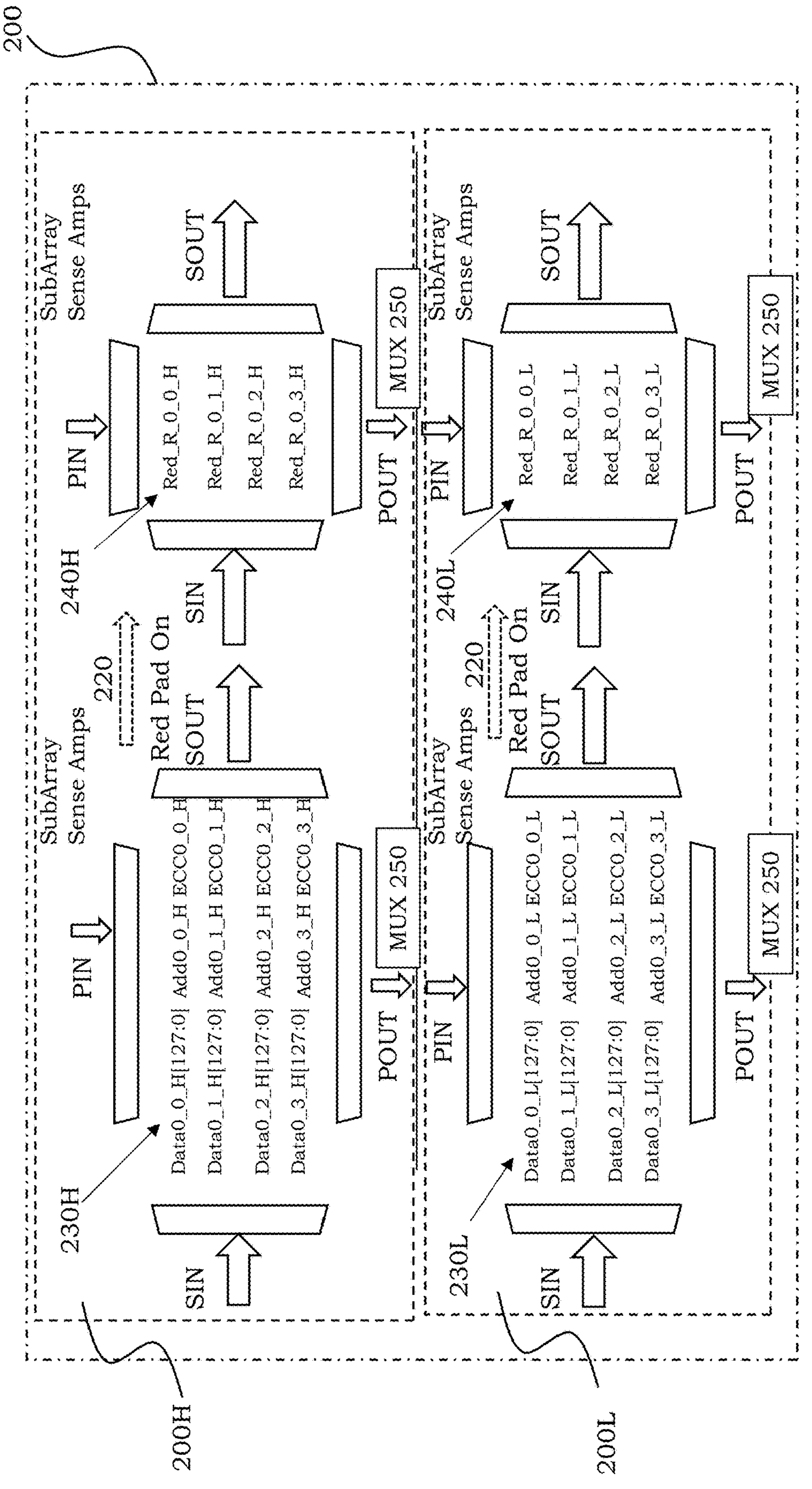
FIG. 2C shows a Flash memory architecture implementing interconnection redundancy using the redundant register of FIG. 2A in accordance with an embodiment of the present disclosure.

For instance, in case of an embedded Flash Replacement architecture, as schematically shown in FIG. 2C, the redundant register 200, also indicated as Red R, is usually split in a high page 200H and a low page 200L.

According to the above explained interconnection redundancy mechanism, in case a defective pad is found and the redundant flag of the first portion 220 is enabled (ON), the redundant register 200 provides for substituting an original cell address 230H with a redundant cell address 240H in the high page 200H as well as an original cell address 230L with a redundant cell address 240L in the low page 200L. The pad redundancy applies to all the extended pages of the subarray and any data in, if the defect is in the used pads, as for flexible TDI.

In particular, a MUX 250 will receive the output parallel data POUT of the redundant cells 240H and 240L instead of the output parallel data POUT of the original cells 230H and 230L when the redundant flag 220 is enabled or ON. The MUX 250 functionality is described below with reference to FIGS. 3A and 3B.

Figure 3A:
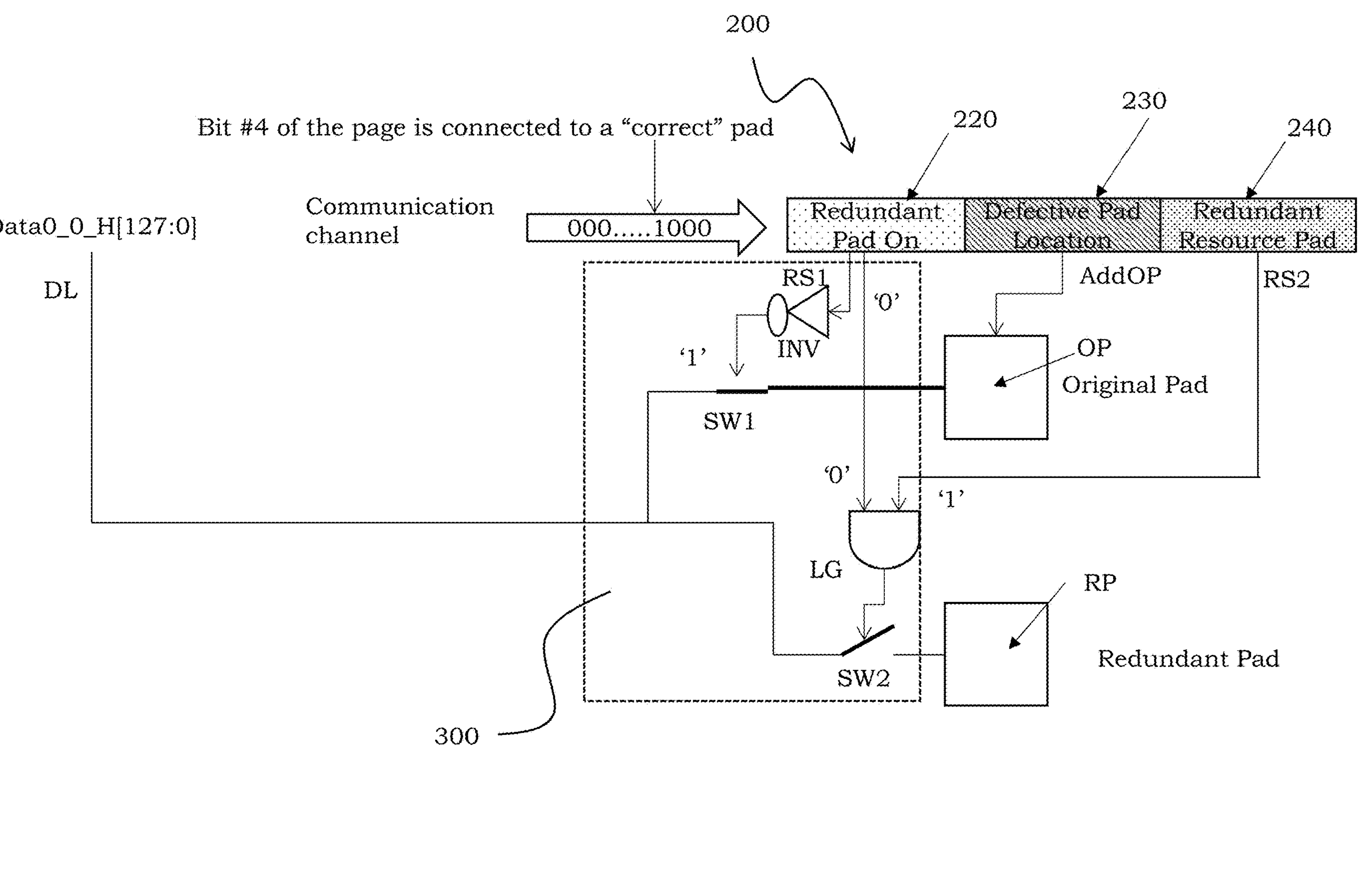
FIGS. 3A and 3B show different working conditions of a selecting circuit of a Flash memory architecture implementing interconnection redundancy using the redundant register of FIG. 2A in accordance with an embodiment of the present disclosure.

The memory architecture 100 may in particular comprise a selection circuit 300 for implementing the interconnection redundancy according to an embodiment of the disclosure, as shown in FIG. 3A.

In particular, the selection circuit 300 is connected to a pad of the memory architecture 100, indicated as original pad OP as well as at least one redundant pad RP and receives addresses and enable signals from the redundant register 200.

More particularly, the selection circuit 300 comprises a first switch SW1 inserted between multiple data lines DL and the original pad OP and a second switch SW2 inserted between the data lines DL and the redundant pad RP. The first switch SW1 is driven by a first redundant signal RS1 being an inverted value of the redundant flag stored in the first portion 220 of the redundant register 200 obtained through an inverting gate INV, while the second switch SW2 is driven by a combination between the first redundant signal RS1 and a second redundant signal RS2 stored in the third portion 240 of the redundant register 200 obtained through a logic gate LG, being an AND gate.

In the example embodiment of FIG. 3A, the communication channel provides the redundant register 200 with an address corresponding to a bit being found as connected to a correctly working original pad OP, whose address AddOP is stored in the second portion 230 of the redundant register 200. In particular, the Bit #4 (000 . . . 1000) of a memory page is connected to a "correct", i.e. a not defective original pad OP.

In this case, the enabling flag stored in the first portion 220 is set equal to 1, so that the first redundant signal RS1 is set equal to 0 and the first switch SW1 is closed by the inverted value equal to 1. Moreover, independently from the value of the second redundant signal RS2, the logic gate LG opens the second switch SW2 due to the first redundant signal RS1 being set equal to 0.

In this way, the data of the data lines DL are provided to the original pad OP, which is correctly working.

Figure 3B:
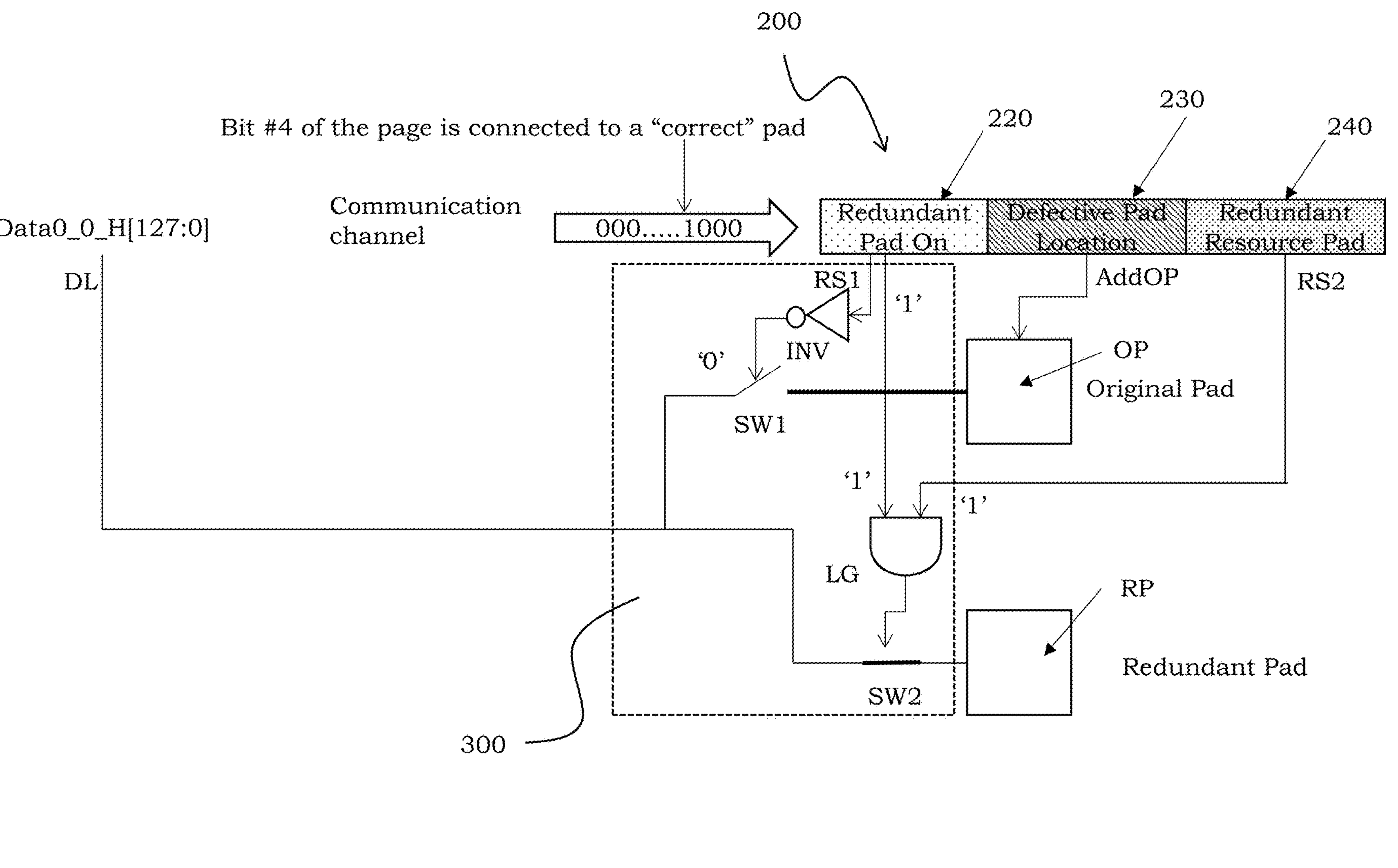

In the example embodiment of FIG. 3B, the communication channel provides the redundant register 200 with an address corresponding to a bit being found as connected to a defective original pad OP, whose address AddOP is stored in the second portion 230 of the redundant register 200. In particular, the Bit #4 (000 . . . 1000) of a memory page is connected to a "bad", i.e. a defective original pad OP.

In this case, the enabling flag stored in the first portion 220 is set equal to 0, so that the first redundant signal RS1 is set equal to 1 and the first switch SW1 is open by the inverted value equal to 0. Moreover, the value of the second redundant signal RS2 is set equal to 1 so that the logic gate LG, also receiving the first redundant signal RS1 being set equal to 1, closes the second switch SW2.

In this way, the data of the data lines DL are provided to the redundant pad RP, so effectively bypassing the original pad OP which is not correctly working.

The redundant register 200 and the selection circuit 300 thus form an interconnection redundancy managing block included into the memory architecture 100.

The exemplary configurations shown in FIGS. 3A and 3B relates to a single defective pad, but it is immediate to verify that the selection circuit 300 can implement the proposed interconnection redundancy for any number of defective pads, up to 168, by increasing the number of registers to store the defect pad and the new one.

The memory architecture 100 can be included, in particular embedded, in a System-on-Chip (SoC) component and the interconnection redundancy may apply to pads connected to the SoC.

Figure 4:
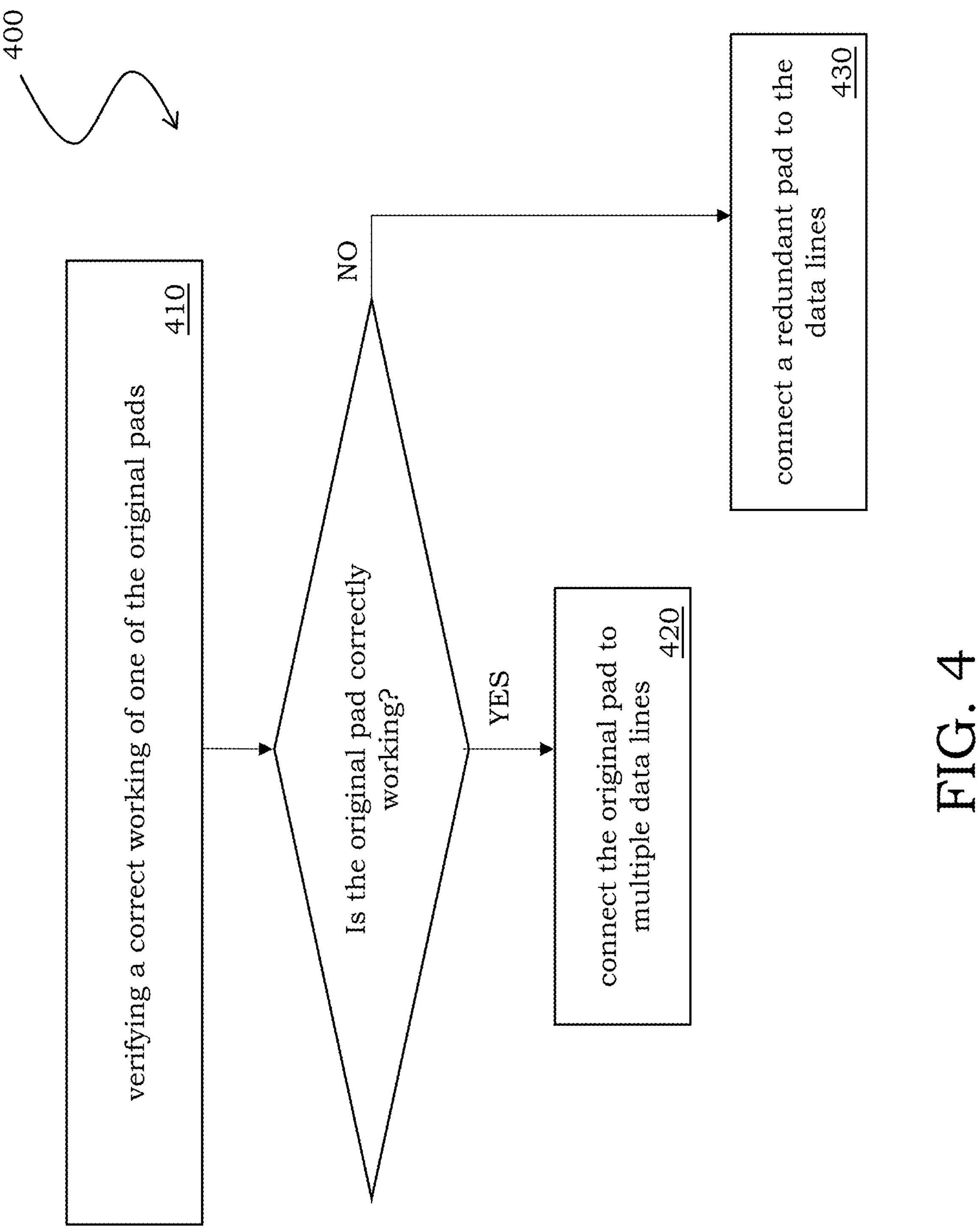
FIGS. 4 and 5 show an exemplary method for managing interconnection redundancy of a memory architecture in accordance with an embodiment of the present disclosure.

An exemplary method for managing interconnection redundancy of a memory architecture 100 comprising a plurality of subarrays of memory cells and a plurality of original pads OP is schematically shown in FIG. 4, the method 400 comprising the steps of:

- step 410: verifying a correct working of one of the original pads OP; and
- step 420: in case the original pad OP is correctly working, connect the original pad OP to multiple data lines DL; or
- step 430: in case the original pad OP is not correctly working, connect a redundant pad RP to the data lines DL.

Figure 5:
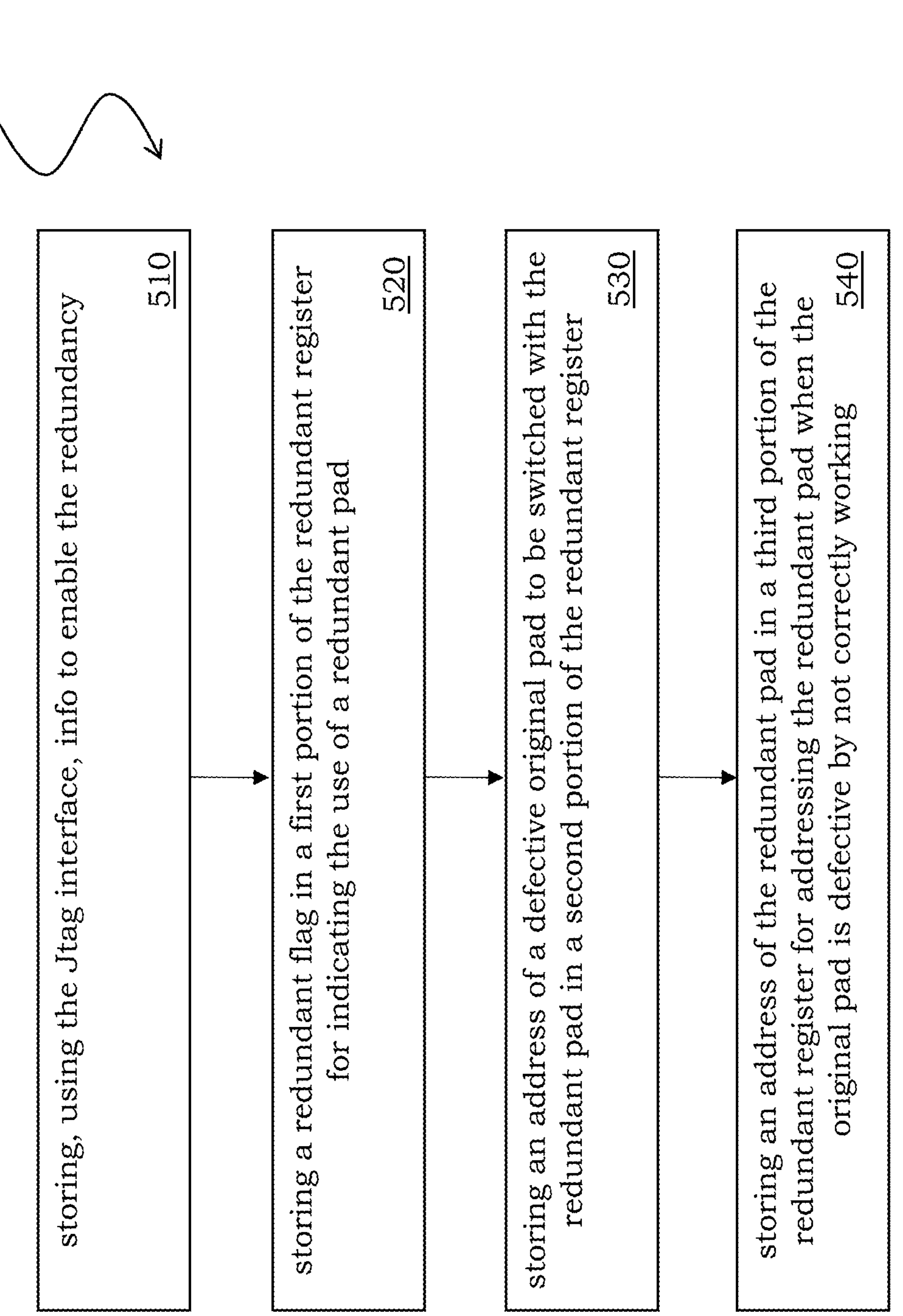

More particularly, making reference to FIG. 5, the method 500 comprises the steps of:

step 510: storing, using the Jtag interface, info to enable the redundancy;

step 520: storing a redundant flag in a first portion 220 of the redundant register 200 for indicating the use of a redundant pad RP; a first redundant signal RS1 is associated to the redundant flag;

step 530: storing an address of a defective original pad OP to be switched with the redundant pad RP in a second portion 230 of the redundant register 200; and step 540: storing in a third portion 240 of the redundant register 200 for addressing the redundant pad RP when the original pad OP is defective by not correctly working; a second redundant signal RS2 is associated to the address stored in the third portion 240.

It should be remarked that the redundant register 200 comprises only one redundant flag per Flash memory subarray 110. In particular, in case of multi position defective, the redundant flag enabling redundancy is not to be repeated.

Summing up, the present disclosure provides a memory architecture comprising a plurality of subarrays, each provided with an interconnection redundancy mechanism implemented by a selection circuit connected to a redundant register.

In this way, latent defects and/or a life defects can be fixed on the fly by a SoC comprising the memory architecture, using firmware routines able to correctly control the redundant register and thus the selection circuit connected thereto.

It is underlined that the number of redundant pads being used can be customized according to needs simply managing the address to be stored and the enabling flag.

The exemplary memory architecture implementing interconnection redundancy also improves safety of the memory and of the Soc; in particular the interconnection redundancy allows to reset errors due to defective or defectively connected pads, thus increasing the ECC coverage, the ECC saving the system from single defect.

Moreover, the interconnection redundancy is suitably replicated for each subarray of the memory architecture.

It should be also remarked that the redundant register, in particular implemented in the embedded Flash Replacement device, is in the SoC that the read page has a bit re-routed somewhere else.

In this way, the interconnection redundancy is a transparent strategy.

Moreover, the redundant register is addressed using the low signal count interface 140 or Jtag interface, with or without a flexible TDI, which is a programmable option to improve the performance of the working of the memory architecture as a whole.

The redundant register size would depend on the number of possible redundant pads, a full interconnection redundancy being theoretically possible.

In a real implementation, the number of possible redundant pads and defects that can be corrected is limited in view of the yield study and/or the pads topology. In some embodiments, each channel (150 or 210) has its own redundant pad resources to repair one or more defective pads (among the 168 pads, in the example described above). In other embodiments, the redundant pad resources may be shared among different channels; e.g., a spare pad resource for redundancy may be addressed to redund a defective pads in any of the interconnection channels of the system. For example, the redundant registers 200 of different channels may flag that redundancy is enabled (in first portion 220), store the address of the failing pad (in second portion 230) and store (in third portion 240) a location or address of a spare pad being used as redundant resource, the redundant resource being a shared resource.

Finally, it is underlined that the defective pads are also stored in the SoC, so as to be able to read the content of a defective pad in the redundant pad instead of the original one.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure.

Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A memory device, comprising:
- a register associated with a first plurality of connection pads and a second plurality of connection pads; and
- control circuitry coupled to the register and configured to:
  - substitute an original pad address of a first page of the register with a redundant pad address of the first page of the register; and
  - substitute an original pad address of a second page of the register with a redundant pad address of the second page of the register, wherein a redundancy associated with the redundant pad address of the first page or the redundant pad address of the second page is either a single-pad redundancy or a multi-pad redundancy.

2. The memory device of claim 1, wherein the single-pad redundancy and the multi-pad redundancy are implemented by the register.

3. The memory device of claim 1, wherein the register comprises a first portion, a second portion, and a third portion.

4. The memory device of claim 3, wherein the first portion of the register comprises a redundant flag that comprises one bit.

5. The memory device of claim 4, wherein the redundant flag indicates a usage of the redundancy.

6. The memory device of claim 3, wherein the second portion stores locations of defective pads.

7. The memory device of claim 3, wherein the third portion stores locations of redundant pads.

8. The memory device of claim 7, wherein the locations of the redundant pads stored in the third portion of the register are used to send data to a system-on-a-chip.

9. The memory device of claim 7, wherein a multiplexor is used to route the redundant pad whose address is stored in the third portion to replace a defective pad.

10. The memory device of claim 3, wherein the register comprises the first portion that includes a redundant bit and the second portion comprising up to four locations of defective pads.

11. The memory device of claim 3, wherein the register comprises the third portion comprising up to four locations of redundant pads.

12. A method, comprising:

determining whether a connection pad of a first plurality of connection pads is defective;

coupling the connection pad of the first plurality of connection pads to a connection pad of a second plurality of connection pads by:

substituting an original pad address of a first page of a register with a redundant pad address of the first page of the register; and substituting an original pad address of a second page of the register with a redundant pad address of the second page of the register;

programming a first type of redundancy using a first memory component; and programming a second type of redundancy using a second memory component.

13. The method of claim 12, further comprising coupling the connection pad of the first plurality of connection pads to the connection pad of the second plurality of connection pads in response to determining that the connection pad of the first plurality of connection pads is defective.

14. The method of claim 12, further comprising enabling a redundant flag of the register in response to determining the connection pad of the first plurality of connection pads is defective.

15. The method of claim 14, further comprising switching a defective pad with a redundant pad in response to determining the connection pad of the first plurality of connection pads is defective.

16. An apparatus, comprising:

a plurality of memory cells;

a register associated with a first plurality of connection pads, a second plurality of connection pads, and control circuitry;

the control circuitry configured to:

substitute an original pad address of a first page of the register with a redundant pad address of the first page of the register; and substitute an original pad address of a second page of the register with a redundant pad address of the second page of the register, wherein a redundancy associated with the redundant pad address of the first page or the redundant pad address of the second page is either a single-pad redundancy or a multi-pad redundancy.

17. The apparatus of claim 16, wherein the original pad address of the register is substituted for every page of memory associated with the original pad address when the original pad address is associated with a defective pad.

18. The apparatus of claim 16, wherein the register includes a high page and a low page.

19. The apparatus of claim 18, wherein an original address in the high page is substituted for a redundant address in the high page in response to determining that a connection pad in the register is defective.

20. The apparatus of claim 18, wherein an original address in the low page is substituted for a redundant address in the low page in response to determining that a connection pad in the register is defective.

* * * * *